United States Patent [19]

Seki

[11] 4,203,047
[45] May 13, 1980

[54] GATE CIRCUIT OF GATE TURN-OFF THYRISTOR

[75] Inventor: Nagataka Seki, Fuchu, Japan

[73] Assignee: Tokyo Shibaura Electric Co., Ltd., Tokyo, Japan

[21] Appl. No.: 888,365

[22] Filed: Mar. 20, 1978

[30] Foreign Application Priority Data

Mar. 24, 1977 [JP] Japan .................................. 52/32396

[51] Int. Cl.² ........................................... H03K 17/72
[52] U.S. Cl. ........................... 307/252 C; 307/252 M; 323/22 SC
[58] Field of Search ...................... 307/252 C, 252 M; 323/22 SC

[56] References Cited

U.S. PATENT DOCUMENTS

| 3,928,775 | 12/1975 | Steigerwald | 307/252 C |
| 4,001,607 | 1/1977 | Dietz | 307/252 C |

Primary Examiner—John Zazworsky
Attorney, Agent, or Firm—Oblon, Fisher, Spivak, McClelland & Maier

[57] ABSTRACT

A first circuit means, which serves to cause reverse flow of a first pulse current of a large rate of rising and a narrow pulse width from cathode to gate of a gate turn-off thyristor in synchronism with the instant when turning off this thyristor, and a second circuit means, which serves to cause reverse flow of a second pulse current of a smaller rate of rising and a wider pulse width than the aforesaid first pulse current in superimposition thereupon from cathode to gate in synchronism with the turn-off instant, are provided.

5 Claims, 16 Drawing Figures

GATE CIRCUIT OF GATE TURN-OFF THYRISTOR

This invention relates to a gate circuit of a gate turn-off thyristor and, more particularly, to an improvement in the turn-off gate circuit of the gate turn-off thyristor.

Figure 1A:
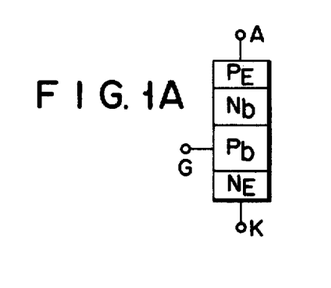
FIGS. 1A and 1B respectively show the construction and symbol of the gate turn-off thyristor.
Figure 1B:
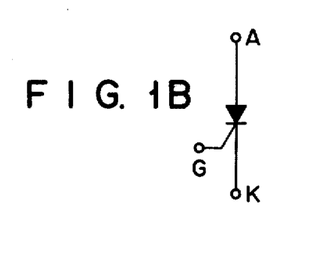

The usual gate turn-off thyristor has a four-layer structure, as shown in FIG. A, consisting of regions $P_E$, $N_b$, $P_b$ and $N_E$, with its gate terminal G provided in the base region $P_b$ of p-conductivity type. With this structure, when a positive voltage is applied to its anode A and a negative voltage to its cathode K, with application of a positive pulse voltage between the terminals G and K such that the terminal G is positive anode current is caused to flow between the terminals A and K, and the anode current is reduced to zero by applying a negative pulse voltage between the terminals G and K such that the terminal G becomes negative. This type of gate turn-off thyristor is represented by a symbol as shown in FIG. 1B.

In actual use of this gate turn-off thyristor (hereinafter referred to as GTO thyristor) in a practical circuit, the construction of the turn-off gate circuit is very important. This turn-off gate circuit corresponds to a commutation circuit of an ordinary thyristor circuit, and it has great influence upon the function and reliability of circuits using the gate turn-off thyristor. In the past, no GTO thyristor of large capacity was used in practice, so that turn-off gate circuits of conventional prior-art rise to no practical problems. Up to date, however, there are high power GTO thyristors with anode current of the order of 200 to 600 A. In order to cut off such large anode current, it is necessary to cause reverse current of 100 to 200 A from cathode K to gate G, and the rising rate (di/dt) of such reverse current is required to be about 30 A/μs. The prior art turn-off gate circuits could not meet such requirements.

Figure 2A:
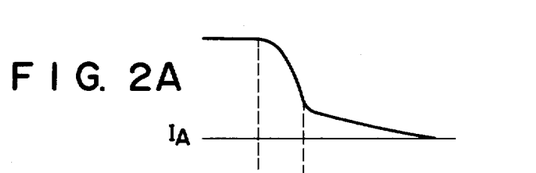
FIGS. 2A to 2C are graphs showing respective waveforms involved in the turn-off process of the gate turn-off thyristor.
Figures 2B, 2C:
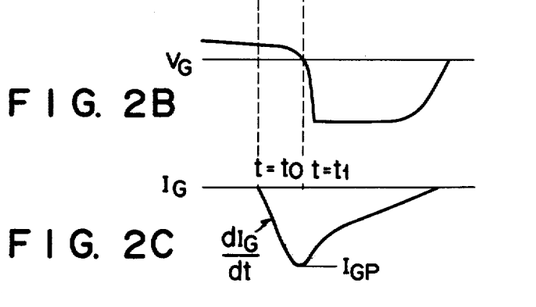

FIGS. 2A to 2C show waveforms that occur in the GTO thyristor at the time of turning off the same. More particularly, FIG. 2A shows the anode current $I_A$ in the GTO thyristor, FIG. 2B the voltage $V_G$ between gate G and cathode K of the thyristor, and FIG. 2C the reverse current $I_G$ caused to flow between cathode K and gate G. The reverse current $I_G$ begins to flow at an instant $t=t_0$, and the cathode current is reduced to zero at an instant $t=t_1$. The anode current $I_A$ begins to reduce from the instant $t=t_0$ because of increase of the impedance between the terminals A and K, and at the instant $t=t_1$ the carriers in the base $P_b$ are reduced to zero to recover insulation between the regions $N_E$ and $P_b$. Subsequently, the carriers within the regions $N_b$ and $P_b$ are discharged as gate current $I_G$ to an outside exhaust circuit, whereby perfect blocking between anode A and cathode K is obtained. In FIG. 2C, $dI_G/dt$ represents the rising rate of the reverse gate current, and $I_{GP}$ the crest value of the reverse current.

Considering the requirements of the turn-off gate circuit, it is necessary to meet the following requirements (1) to (3):

(1) The rising rate $dI_G/dt$ of the gate reverse current should be large. With a small rising rate the GTO thyristor will be destroyed because of a large switching loss. The rising rate is required to be several tens of amperes per micro second.

(2) The crest value $I_{GP}$ of the gate reverse current $I_G$ should be above a predetermined value when the terminals G and K are connected to be short circuited. The ratio $I_A/I_G$ of the anode current $I_A$ capable of turning off the GTO thyristor to the gate reverse current $I_G$ is commonly termed turn-off gain G and is typically $G=3$ to 5. Thus, with anode current of $I_A=600$ A and turn-off gain of $G=3$ a crest value of $I_{GP}=200$ A is required.

(3) The carriers $Q_{stg}$ stored in the respective regions $P_b$ and $N_b$ should be capable of being absorbed in the gate turn-off circuit. This means that the quantity $Q_s$ of carriers supplied from the turn-off gate circuit to the GTO thyristor should satisfy the relation $Q_s > Q_{stg}$.

Problems that must be solved regarding the prior art turn-off gate circuits will now be discussed. The typical prior art turn-off gate circuits include a charging and discharging capacitor type and a pulse transformer type, which are principally shown in FIGS. 3A and 3B respectively. In the charging and discharging capacitor system shown in FIG. 3A, a capacitor 21 is previously charged to an illustrated polarity by a charging circuit not shown, and reverse current $I_G$ is caused to flow from the cathode K to gate G of the GTO thyristor 1 by closing a switch 22 in synchronism with the instant of turning off the GTO thyristor 1. The closed circuit constituted by the gate G and cathode K of the GTO thyristor 1 and the turn-off gate circuit includes inductance of at least 1 to 2μH even if wiring is made with as small lead length as possible. Thus, assuming $dI_G/dt=30$ A/μs the afore-mentioned requirement (1) (i.e., requirement regarding $dI_G/dt$) can be met by charging the capacitor 21 such that its terminal voltage $V_c$ is 30 to 60 V. In addition, the requirement (2) (i.e., requirement regarding $I_{GP}$) can be met by making the resistance component of the aforesaid closed circuit sufficiently small. Further, the requirement (3) (i.e., requirement regarding $Q_s > Q_{stg}$) can be met by using as the capacitor 21 with a capacitance above a value determined as $Q_{stg}/V_c$ ($V_c$ being terminal voltage across the capacitor 21). In this case, it is necessary to select the capacitance of the capacitor 21 to be several tens to 100 μF.

Figure 3A:
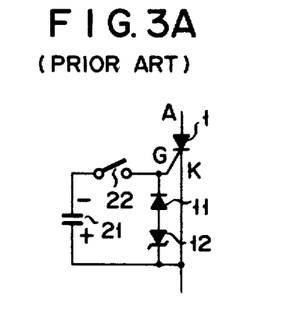
FIGS. 3A and 3B are circuit diagrams showing respective prior art turn-off gate circuits.

However, when using the turn-off gate circuit shown in FIG. 3A, the following problems are encountered. In the first place, in case when suddenly turning off this GTO thyristor due to occurrence of some defectiveness in the circuit employing this GTO thyristor or when using this GTO thyristor for high frequency purpose, it is desirable to charge the capacitor 21 in as short period of time as possible, for instance of the order of 100 μsec. However, doing so leads to extreme cost-up of the charging circuit since the charging current increases in inverse proportion to the charging period. Secondly, it is extremely difficult to construct a protective circuit for preventing the voltage $V_{GR}$ applied between the gate G and cathode K of the GTO thyristor from exceeding a predetermined value. When insulation between the regions $P_b$ and $N_E$ is recovered at the instant $t=t_1$ as shown in FIG. 2B, the voltage $V_{GR}$ determined by the voltage across the capacitor 21 and the impedance of the gate circuit at the instant of the recovery is applied between gate G and cathode K. Thus, it is apparent that the higher the voltage across the capacitor 21 the higher is the voltage $V_{GR}$. Meanwhile, since the breakdown voltage of the junction between the regions $N_E$ and $P_b$ is 15 V, rupture of this junction results when the reverse voltage applied between the terminals G and K exceeds 15 V. In order to prevent this rupture, a protective circuit consisting of a zener diode 12 and a diode 11 is connected between the terminals G and K to thereby restrict the aforesaid voltage $V_{GR}$ to the zener voltage. The diode 11 is provided for preventing the turn-on current from the turn-on gate circuit (not shown) of the GTO thyristor from partly flowing into the protective circuit.

The turn-off power to be supplied from the turn-off circuit to the GTO thyristor is determined in accordance with the anode current $I_A$ to be cut off GTO, as mentioned earlier. Thus, for turning off the GTO thyristor in case when the anode current is extremely low, only part of the afore-mentioned turn-off power is used to turn off the GTO thyristor, with the rest being consumed by the protective element such as the zener diode 12. With increase of the capacity of the GTO thyristor the afore-mentioned turn-off power is increased, so that turn-off power of the order of 100 W is required. If this order of power is to be consumed by the zener diode 12, it is necessary to connect about 15 commercially available zener diodes of the maximum rating in parallel.

Figure 3B:
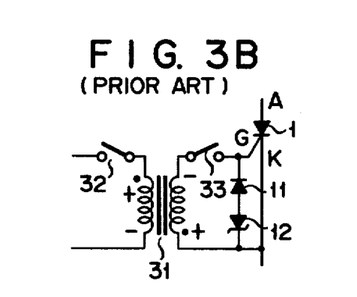

Now, problems that are presented by the pulse transformer type circuit shown in FIG. 3B will be discussed. Referring to FIG. 3B, when switches 32 and 33 are closed in synchronism with the instant of turning off the GTO thyristor 1, the pulse transformer 31 is excited by a d-c power source (not shown), causing reverse current $I_G$ to flow from cathode K to gate G of the GTO thyristor 1. Since this system does not require the step of charging the capacitor 21 as shown in FIG. 3A, it is suited for use for high frequency purposes. However, since there is leakage inductance in the pulse transformer 31, the rising rate $dI_G/dt$ of the output pulse current is low (for instance, about one-fifth of the circuit shown in FIG. 3A). Thus, the afore-mentioned requirement (1) (requirement regarding $dI_g/dt$) cannot be satisfied unless the power source voltage for the pulse transformer is increased. This causes the capacity of the afore-mentioned protective circuit to be greater.

It will be understood from the above description that if it is intended to satisfy all the requirements (1), (2) and (3) for the turn-off gate circuit in the prior-art circuits, the construction of the protective circuit connected between gate G and cathode K is inevitably increased in scale to dictate sacrifice in utility in various respects such as performance and cost of the turn-off gate circuit and arrangement of parts.

An object of the invention, accordingly, is to provide a turn-off gate circuit, which permits turn-off current of a large rising rate to be supplied to the GTO thyristor and thus permits reduction of power consumption in the protective circuit connected between cathode and gate of the GTO thyristor so that it is suited for GTO thyristor of large capacities.

The turn-off gate circuit according to the invention comprises a first circuit means connected between the cathode and gate of a gate turn-off thyristor such as to cause a first pulse current of a large rising rate and a narrow pulse width to flow as reverse current from the cathode to the gate of the gate turn-off thyristor in synchronism with the instant of turning off the gate turn-off thyristor, and a second circuit means connected parallel to the first circuit means such as to cause reverse flow of a second pulse current of a smaller rate of rising and a wider pulse width than the aforesaid first pulse current in superimposition thereupon from the cathode to gate in synchronism with the turn-off instant.

This invention can be more fully understood from the following detailed description when taken in conjunction with the accompanying drawings, in which:

FIGS. 8 to 12 are circuit diagrams showing second to sixth embodiments of the invention respectively.

Figure 4:
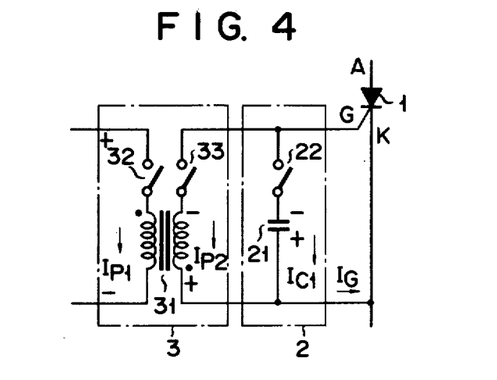
FIG. 4 is a circuit diagram showing the basic circuit construction according to the invention.

In all the Figures, like parts are designated by like reference numerals. Referring now to FIG. 4, a first circuit means 2 includes a capacitor 21, which is charged by a power source (not shown) to the illustrated polarity and connected between the gate and cathode of a GTO thyristor 1 through a switch 22 which is adapted to be closed in synchronism with the instant of turning off the GTO thyristor. When the capacitor 21 is discharged, it produces a first pulse current having a quick rising rate $dI_G/dt$ and of a comparatively short duration, the pulse being coupled between the terminals K and G of the GTO thyristor. A second circuit means 3 includes a pulse transformer 31 having the primary winding connected through a switch 32 to a power source (not shown) and the secondary winding connected between the terminals G and K through a switch 33. When the switches 32 and 33 are closed in synchronism with the switch 22, the secondary winding shows the illustrated polarity (black dot representing the positive polarity) to supply a second pulse current $I_{P2}$, which has a smaller rising rate than that of the discharge current $I_{C1}$ from the capacitor 21 but has a longer duration than the discharge current $I_{C1}$, to between the terminals K and G. The pulse transformer 31 is connected to a d-c voltage source of low voltage. When the switches 22, 32 and 33 are closed at an instant $t=t_0$ as shown in FIGS. 2A to 2C, current $I_G$ constituted by the discharge current $I_{C1}$ from the capacitor 21 superimposed upon the secondary current $I_{P2}$ from the pulse transformer 31 flows as reverse current from cathode K to gate G. By reducing the discharging period of the capacitor 21, reverse current of a large rising rate $dI_G/dt$ and a large crest value can be supplied. This means that the afore-mentioned requirements (1) and (2) of the turn-off gate circuit can be met. Further, the pulse transformer 31 can meet the circuit requirement (3) since the secondary current $I_{P2}$ has a smaller rising rate $dI_{P2}/dt$ than the afore-mentioned rate $dI_{C1}/dt$ but has a long duration.

Figures 6, 7:
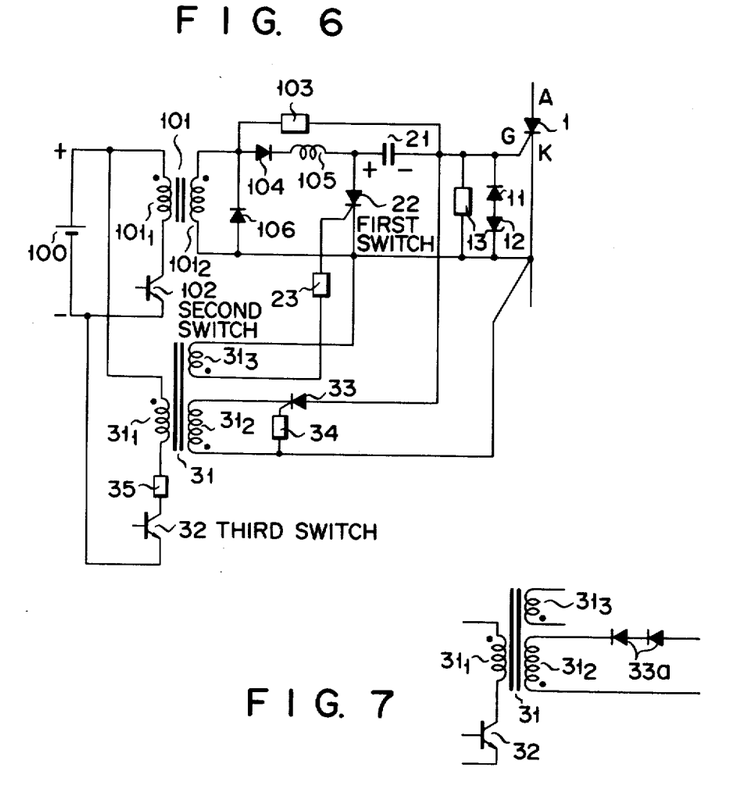
FIG. 6 is a circuit diagram showing a first embodiment according to the invention.
FIG. 7 is a circuit diagram showing a modification of the circuit shown in FIG. 6.

FIG. 6 shows a first embodiment of the invention which will now be described. Elements 11, 12 and 21 are the same as those described in connection with FIGS. 3A and 3B and are no longer described here. A thyristor 22, which serves the role of the switch 22 shown in FIG. 4, is connected as a first switching element, and a resistor 13 is connected between gate G and cathode K. Designated at 101 is a first pulse transformer, which has its primary winding 101₁ connected through a second switching element 102 (a transistor) to a power supply 100 and its secondary winding 101₂ connected at one end (positive terminal) through a diode 104 and a reactor 105 to the anode of the first switching element 22 and at the other end (negative terminal) to the cathode of the element 22. A diode 106 is connected in the illustrated polarity across the secondary winding $101_2$. A resistor 103 is connected between the anode of the diode 104 and the gate G of the GTO thyristor. A second pulse transformer 31 has its primary winding $31_1$ connected in the illustrated polarity through a resistor 35 and a third switching element 32 to the power supply 100 and its secondary winding $31_2$ connected at one end (negative terminal) through a switching element 33 (thyristor) to the gate G and at the other end (positive terminal) to the cathode K. The primary winding $31_1$ may of course be connected to a power source different from the power supply 100. The terminal voltage across the secondary winding $31_2$ is coupled through a resistor 34 to the gate of the switching element 33. Further, the terminal voltage across a second secondary winding $31_3$ of the second pulse transformer 31 is coupled through a resistor 23 to between the cathode and gate of the first switching element 22. The circuit including the capacitor 21, first switching element 22, second switching element 102, pulse transformer 101 and power supply 100 corresponds to the first circuit means shown in FIG. 4, and the circuit including the pulse transformer 31, third switching element 32 and power supply 100 corresponds to the second circuit means shown in FIG. 4. The black dots shown at the individual windings of the first and second pulse transformer 101 and 31 indicate the positive polarity of the voltage induced across these windings when the switching elements 102 and 32 are closed.

The operation of the circuit shown in FIG. 6 will now be described. When the second switching element 102 (transistor) is triggered, the first pulse transformer 101 is excited to induce a voltage across the secondary winding $101_2$. Thus, current is caused to flow through a closed circuit from the secondary winding $101_2$ through the resistor 103 and terminals G and K back to the secondary winding $101_2$. At the same time, current is also caused to flow through a closed circuit from the secondary winding $101_2$ through the diode 104, a reactor 105, a capacitor 21 and terminals G and K back to the secondary winding $101_2$, so that the capacitor 21 is charged to the illustrated polarity. The voltage $V_c$ built up across the capacitor 21 reaches about double the voltage induced across the secondary winding $101_2$ by the effect of the reactor 105. In this case, the frequency of oscillating current determined by the reactor 105 and capacitor 21 is set to be sufficiently higher than the frequency of the circuit employing the GTO thyristor 1. The transistor 102 may be set such that it becomes non-conductive after completion of charging of the capacitor 21.

Figure 5:
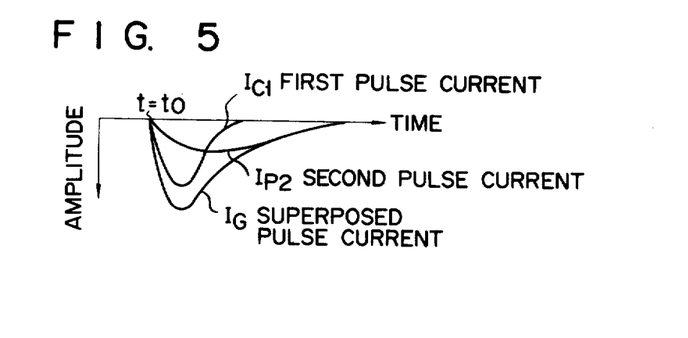
FIG. 5 is a graph showing the gate turn-off current in the circuit according to the invention.

When turning off the GTO thyristor 1 subsequently, the third switching element (transistor) 32 is rendered conductive. At this time, the voltages of the illustrated polarities induced across the secondary windings $31_2$ and $31_3$ of the second pulse transformer 31 are impressed upon the respective gates of the thyristors 33 and 22 to simultaneously trigger these thyristors 33 and 22. With the triggering of the thyristor 22 the capacitor 21 is quickly discharged through a closed circuit from the capacitor 21 through the thyristor 22 and terminals K and G back to the capacitor 21, causing reverse current (first pulse current) shown at $I_{C1}$ in FIG. 5 to flow between cathode K and gate G. Also, with the triggering of the thyristor 33 reverse current (second pulse current) shown at $I_{P2}$ in FIG. 5 is caused to simultaneously flow through a closed circuit from the secondary winding $31_2$ through the terminals K and G and thyristor 33 back to the secondary winding $31_2$. The GTO thyristor 1 can be readily turned off with the resultant $I_G$ of these two reverse currents $I_{C1}$ and $I_{P2}$. The capacitor 21 has a comparatively low capacitance and completes the discharge in a short period of time as shown at $I_{C1}$ in FIG. 4, causing the current through thyristor 22 to be readily reduced to a value below the holding current, and after the turn-off of the GTO thyristor 1 reverse voltage produced between the cathode K and gate G of the GTO thyristor is directly impressed between the cathode and anode of the thyristor 22, so that the thyristor 22 can be readily turned off. By setting the voltage across the secondary winding $31_2$ of the second pulse transformer 31 to be lower than the zener voltage of the zener diode 12, after carriers stored in the regions $N_b$ and $P_b$ of the GTO thyristor are discharged through the secondary winding $31_2$ the current through this secondary winding is limited by the resistor 13 and thus becomes practically zero. At an instant when current through the secondary winding $31_2$ is reduced to zero in this way, the transistor 32 is cut off. If the voltage across the secondary winding $31_2$ is higher than the zener voltage, current flowing through the zener diode 12 and diode 11 is also supplied from the pulse transformer 31 in addition to the current required to discharge the afore-mentioned carriers of the GTO transistor 1. Therefore, it is desirable to make the induced voltage across the secondary winding $31_2$ to be below the protective voltage level, i.e., zener voltage. With the cutting-off of the transistor 32 the thyristor 33 is also cut off. It will be appreciated that in the instant embodiment it is possible to achieve the end of turning off the GTO thyristor 1 with a low capacitance of the capacitor 1 and also without increasing the capacity of the protective circuit.

The thyristor 33 in FIG. 6 is provided to the end of preventing turn-on current from partly flowing from the turn-on gate circuit to the secondary winding $31_2$ when turning on the GTO thyristor. Thus, the thyristor 33 can be replaced with a plurality of diodes 33a connected in series with the secondary winding $31_2$, as shown in FIG. 7, with the voltage drop across this diode group made to be greater than the turn-on voltage between the terminals G and K of the GTO thyristor.

Figure 8:
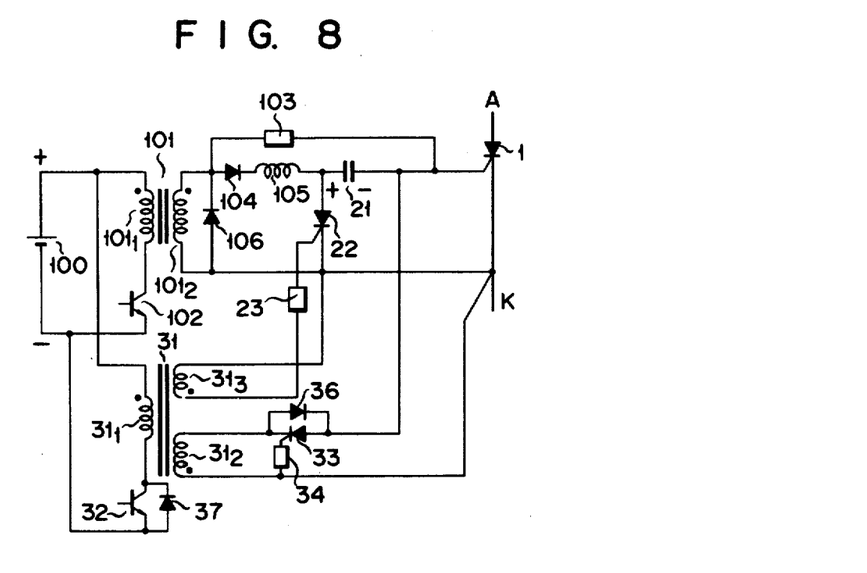

FIG. 8 shows a second embodiment of the invention which will now be described. In this embodiment, the protective circuit in the embodiment of FIG. 6, comprising the diode 11 and zener diode 12, is omitted and in lieu thereof diodes 37 and 36 are connected in the illustrated polarities in parallel with transistor 32 and thyristor 33 respectively. With this construction, after the GTO thyristor 1 is turned off the energy remaining in the capacitor 21 is fed back to the power supply 100. In the embodiment of FIG. 6, by operating the turn-off gate circuit when the anode current $I_A$ of the GTO thyristor 1 is substantially zero the GTO thyristor is immediately turned off, so that the current discharged from the capacitor 21 after the turning-off of the GTO thyristor flows through and is consumed in the zener diode 12. In the circuit of FIG. 8, however, a closed circuit including the capacitor 21, thyristor 22, cathode K, secondary winding $31_2$ of the pulse transformer 31, diode 36 and capacitor 21 is formed, and a closed circuit including the primary winding $31_1$, power source 100, diode 37, primary winding $31_1$ is also formed. Thus, the afore-mentioned discharging current from the capacitor 21 flows through these closed circuits, so that the energy possessed by the capacitor 21 is fed back to the power supply 100 without being consumed within the protective circuit as shown in FIG. 6. In this case, the voltage induced across the secondary winding $31_2$ may be set to be less than the breakdown voltage between the terminals G and K of the thyristor 1. The current that is supplied to the secondary winding $31_2$ when the GTO thyristor 1 is turned off with the triggering of the transistor 32 flows through a loop constituted by the secondary winding $31_2$, cathode K, diode 106, resistor 103, thyristor 33 and secondary winding $31_2$, so that the current through the secondary winding is limited to a very slight value. It will be seen that in the second embodiment when the GTO thyristor 1 is turned off in case of a light load, the surplus energy of the capacitor 21 is fed back to the power source 100 and regenerated, and also the current that flows through the secondary winding $31_2$ after completion of the turn-off is limited to very slight current. On the other hand, when the thyristor 1 is turned off in case of full load the aforementioned requirements (1), (2) and (3) of the turn-off circuit can be satisfied. Thus, it is possible to provide a gate turn-off thyristor with turn-off gate circuit of very high utility.

Figure 9:
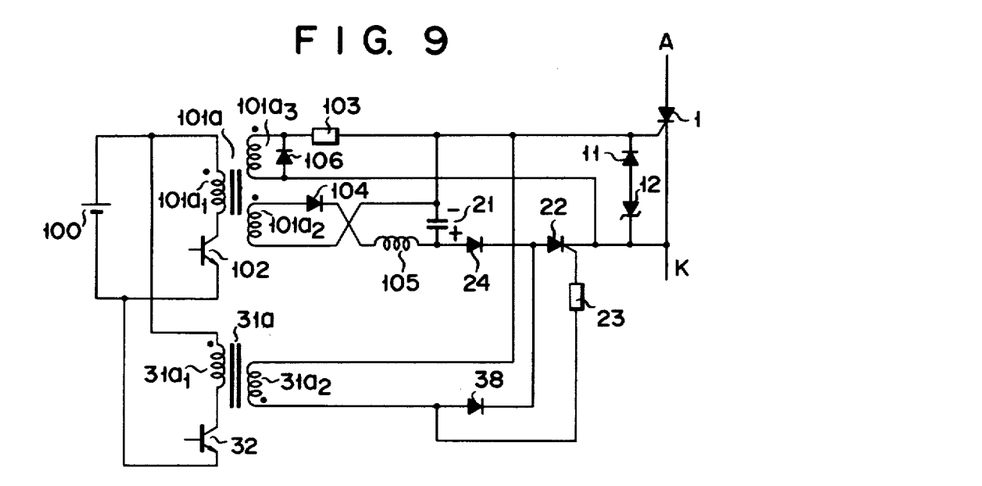

FIG. 9 shows a third embodiment of the invention, which features that the means for charging the capacitor 21 is different from that in the first embodiment of FIG. 6. In the circuits shown in FIGS. 6 and 8, the capacitor 21 is charged through the gate G and cathode K of the GTO thyristor 1. In the third embodiment, however the charging can be obtained without agency of these terminals G and K, so that it is possible to freely select the value of the charging current. Also this circuit features that the number of thyristors used in this case is smaller by one than that in the circuit of FIG. 6 since the first and second circuit means are connected in parallel through the diode 24 and 38. In this embodiment, a first pulse transformer $101a$ has a primary winding $101a_1$, a first secondary winding $101a_2$ and a second secondary winding $101a_3$, and a second pulse transformer $31a$ has a primary winding $30a_1$ and a secondary winding $30a_2$. The second secondary winding $101a_2$ is connected through a diode 104 and a reactor 105 to the capacitor 21 so that the capacitor can be charged in the illustrated polarity, and the second secondary winding $101a_3$ is connected through a resistor 103 to between the terminals G and K of the GTO thyristor 1 in the illustrated polarity. The capacitor 21 has its positive electrode connected through a diode 24 and a first switching element (thyristor) 22 to the cathode K of the GTO thyristor 1 and its negative electrode to the gate G thereof. The secondary winding $31a_2$ of the second pulse transformer $31a$ is connected in the illustrated polarity through a diode 38 and a first switching element (thyristor) 22 to between the terminals K and G. It will be apparent from the description shown in FIG. 6 that by turning on the second switching element (transistor) 102 the GTO thyristor is turned on while at the same time charging the capacitor 21 to the illustrated polarity and that by turning on the third switching element (transistor) 32 the first pulse current from the capacitor 21 and the second pulse current from the second winding $31a_2$ are simultaneously supplied to the GTO thyristor, and no further description is made here.

Figure 10:
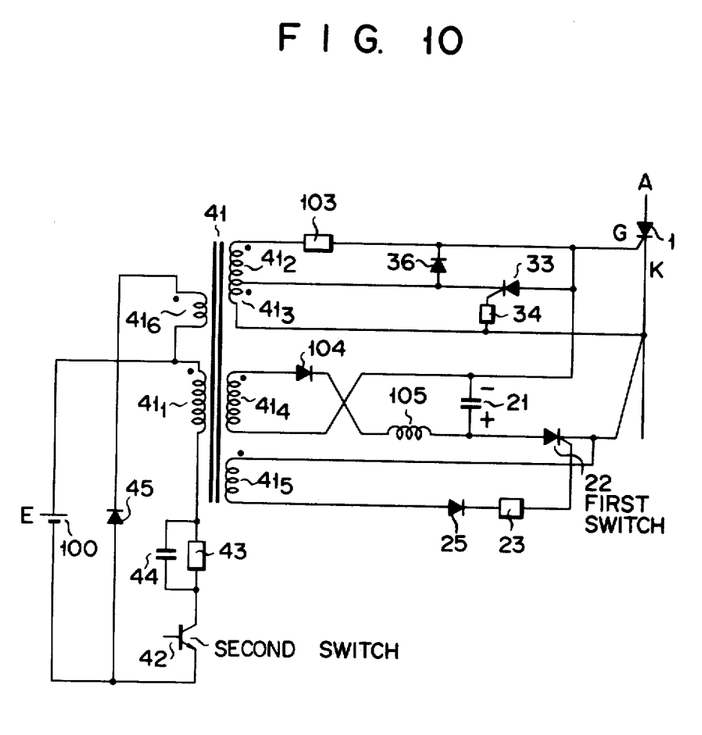

FIG. 10 shows a fourth embodiment of the invention, which features that a single pulse transformer is commonly used both for first and second circuit means. In FIG. 10, a pulse transformer 41 has first to sixth windings $41_1$ to $41_6$. The primary winding $41_1$ is connected through a parallel circuit consisting of a resistor 43 and a capacitor 44 and a fourth switching element (transistor) 42 to a power supply 100. Similar to the previous Figures, the positive side of the voltage induced in each winding when the transistor 42 is triggered is represented by the black dot. The positive terminal of the second winding (first secondary winding) $41_2$ is connected through a resistor 103 to a gate G, the negative terminal of the second winding $41_2$ and the positive terminal of the third winding (second primary winding) $41_3$ are commonly connected through a thyristor 33 of the illustrated polarity to the gate G, and the negative terminal of the third winding $41_3$ is connected to the cathode. A diode 36 of the illustrated polarity is connected between the cathode K and gate G of the thyristor 33, and the gate of the thyristor 33 is connected through a resistor 34 to the negative terminal of the third winding $41_3$. The fourth winding (third secondary winding) $41_4$ has its positive terminal connected through a diode 104, a reactor 105, a first switching element (thyristor) 22 to a cathode K and its negative terminal connected to the gate G. The capacitor 21 is connected between the gate G of the GTO thyristor and the anode of the thyristor 22. The fifth winding (fourth secondary winding) $41_5$ has its positive terminal connected to the cathode K and its negative terminal connected through a diode 25 and a resistor 23 to the gate of the thyristor 22. The sixth winding (second primary winding) $41_6$ has its positive terminal connected through a diode 45 of the illustrated polarity to the negative terminal of the power supply 100 and its negative terminal connected to the power supply 100.

When the transistor 42 is triggered, the GTO thyristor 1 is turned on by the resultant of the voltages induced across the respective second and third windings $41_2$ and $41_3$. Also, similar to the third embodiment as shown in FIG. 9, when voltage is induced across the fourth winding $41_4$, the capacitor 21 is charged to the illustrated polarity by the effect of resonance between the capacitor 21 and reactor 105. The fourth switching element (transistor) 42, unlike the third switching element (transistor) 32, is held in the "on" state during the period of conduction of the GTO thyristor 1. During the "on" state the pulse transformer 41 is saturated, whereby the current flowing through the first winding $41_1$ is restricted to a value determined by a resistor 43.

Denoting the voltage of the power supply 100 by E and the resistance of the resistor 43 by R the current through the first winding or the first primary winding $41_1$ of the pulse transformer 41 is E/R. When the transistor 42 is cut off to turn off the GTO transistor 1, the exciting current through the pulse transformer 41 is cut off, so that at the moment of cut-off the polarity of the voltage induced across each winding is reversed from the illustrated polarity. As a result, the thyristor 22 and 33 are simultaneously triggered. With the triggering of the thyristor 22 a first pulse current from the capacitor 21 is caused to flow reversely from cathode K to gate G, and with the triggering of the thyristor 33 current through the third winding $41_3$ is caused to flow as a second pulse current reversely from cathode K to gate G through a loop from the third winding $41_3$ through the cathode K, gate G, thyristor 33 back to the third winding $41_3$. Denoting the turns numbers of the windings $41_1$ to $41_6$ by $n_1$ to $n_6$ respectively, the magnitude of the current through the third winding $41_3$, that is, the maximum value of the second pulse current, is represented by $n_1E/n_3R$. Thus, by the resultant of the discharge current (i.e., the first pulse current) of a large rising rate from the capacitor 21 and the current from third winding $41_3$, of a longer duration than that of the discharge current, (i.e., second pulse current) the GTO thyristor 1 can be readily turned on.

In the circuit shown in FIG. 10, in case when turning off the GTO thyristor 1 in a light load state thereof, the insulation between the terminals G and K of the GTO thyristor is recovered before the capacitor 21 is completely discharged. In such a case, the extra charge in the capacitor 21 is discharged through a loop from the capacitor 21 through the thyristor 22, cathode K, third winding $41_3$, diode 36 and capacitor 21. Here, by appropriately selecting the ratio between the turns number $n_6$ of the sixth winding of second primary winding $41_6$ and the turns number $n_3$ of the third winding $41_3$ of the pulse transformer 41, the potential on the sixth winding $41_6$ on the side of the black dot becomes lower than the potential at the negative terminal of the power supply 100, thus rendering the diode 45 conductive to clamp the terminal voltage across the second secondary winding $41_6$ to the voltage E. Thus, the terminal voltage across the third winding $41_3$ becomes $n_3E/n_6$. It will thus be seen that the turns numbers $n_3$ and $n_6$ may be selected such that this voltage $n_3E/n_6$ is below the breakdown voltage between the terminals G and K of the GTO thyristor 1. In this way, the surplus energy in the capacitor 21 can be fed back to the power supply 100.

Figure 11:
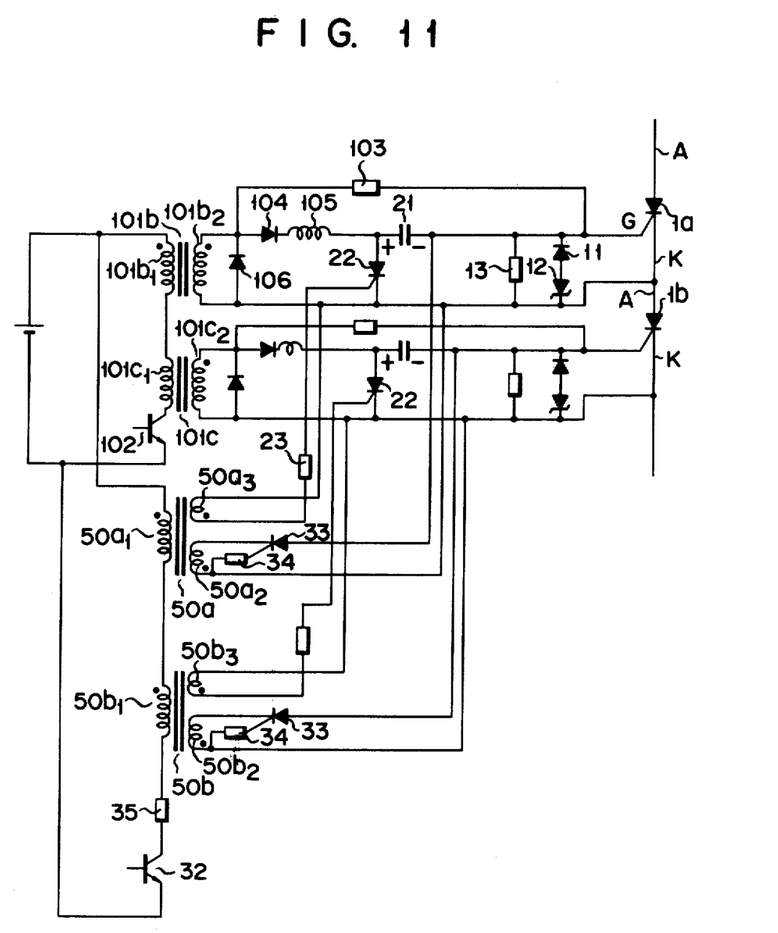

FIG. 11 shows a fifth embodiment of the invention. In this example, the second pulse current is supplied to the GTO thyristor through current transformers. This embodiment can be effective when it is applied to a case with a plurality of GTO thyristors connected in series. In FIG. 11, GTO thyristors 1a and 1b are connected in series.

Pulse transformers 101b and 101c have primary windings $101b_1$ and $101c_1$ connected through a second switching transistor 102 to the power supply 100 and second windings $101b_2$ and $101c_2$ of the same number of turns. In this embodiment, the component parts 11, 12, 13, 21, 22, 103, 104, 105 and 106 as shown in FIG. 6 are connected to the respective secondary winding $101b_2$ and $101c_2$ in the illustrated manner, and the capacitors 21 for the secondary windings $101b_2$ and $101c_2$ each supply the first pulse current to the respective GTO thyristors 1a and 1b. Current transformers 50a and 50b have respective primary windings $50a_1$ and $50b_1$ connected through a resistor 35 and a third switching element (transistor) 32 to a power supply 100. A secondary winding $50a_2$ corresponding to the primary winding $50a_1$ supplies a second pulse current through a thyristor 33 to the GTO transistor 1a, and a secondary winding $50b_2$ corresponding to the primary winding $50b_1$ supplies second pulse current through a thyristor 33 to the GTO thyristor 1b. A secondary winding $50a_3$ corresponding to the primary winding $50a_1$ serves to turn on the thyristor 22 connected to the secondary winding $101b_2$ of the pulse transformer 101b, and a secondary winding $50b_3$ corresponding to the primary winding $50b_1$ serves to turn on the thyristor 22 connected to the secondary winding $101c_2$ of the pulse transformer 101c. The operation of the circuit shown in FIG. 11 is entirely the same as that of the circuit shown in FIG. 6 and hence will be described no further. Since the primary winding of the current transformer can use a mere conductor penetrating a core, in case where a number of GTO thyristors are connected in series it is possible to use a straight-through current transformer.

Figure 12:
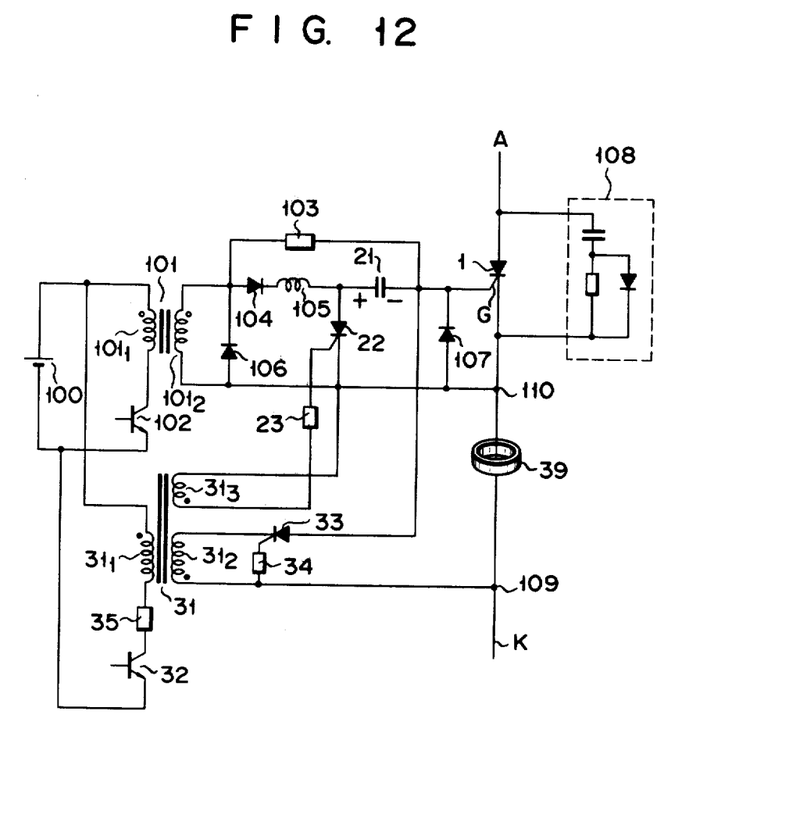

FIG. 12 shows a sixth embodiment of the invention, which will now be described. The first and second pulse transformers 101 and 31 have already been described with reference to FIG. 6. This embodiment features that a conductor connecting the juncture 109 between the positive terminal of the secondary winding $31_2$ of the second pulse transformer 31 and the cathode K of the GTO thyristor 1 and the juncture 110 between the negative terminal of the secondary winding $101_2$ of the first pulse transformer penetrates a magnetic core 39. A circuit 108 connected between anode A and cathode K is a well-known snubber circuit. In the course of turning off the GTO thyristor a voltage V is developed from the anode A to the cathode K. If the rising rate dV/dt is too large, the GTO thyristor is turned on again, so that it is desirable to restirct this dV/dt to a suitable value. The magnetic core 39 serves this end. When causing reverse current from the secondary winding $31_2$ of the second pulse transformer 31 to flow from cathode K to gate G the magnetic core 39 is set to a predetermined magnetized state by the second pulse current, whereby the value of the dV/dt is limited to a predetermined value.

What is claimed is:

1. A gate circuit of a gate turn-off thyristor, which comprises:
    a first circuit means connected between the cathode and gate of a gate turn-off thyristor so as to cause a first pulse current of a large rising rate and a narrow pulse width to flow as reverse current from the cathode to the gate of said gate turn-off thyristor when said gate turn-off thyristor is turned off, wherein said first circuit means includes a first switching element adapted to be turned on when said gate turn-off thyristor is turned off, a capacitor adapted to be charged to such a polarity as to cause reverse flow of the discharge current from said capacitor as said first pulse current from the cathode to the gate of said gate turn-off thryistor through said first switching element when said first switching element is rendered conductive, and a pulse transformer connected to a power source through a second switching element adapted to be rendered conductive at a desired instant and adapted to charge said capacitor to said polarity when said second switching element is rendered conductive; and
    a second circuit means connected in parallel to said first circuit means so as to cause reverse flow of a second pulse current of a smaller rate of rising and a wider pulse width than said first pulse current in superimposition thereupon from said cathode to gate when said gate turn-off thyristor is turned off, wherein said second circuit means includes one of an additional pulse transformer and a current transformer having a primary winding connected to a power source through a third switching element adapted to be turned conductive when said gate turn-off thryistor is turned off and a secondary winding to cause said second pulse current to flow reversely from the cathode to the gate of said gate turn-off thyristor when said third switching element is rendered conductive.

2. The gate circuit of a gate turn-off thyristor according to claim 1, wherein said gate circuit further comprises feed back means for feeding energy possessed by said capacitor back to said power source after said gate turn-off thyristor has been turned off; said feed back means comprising a first loop and a second loop, said first loop including said capacitor, said first switching element, said secondary winding and a diode connected in series with said secondary winding with a polarity which permits the discharge current of said capacitor to flow through said secondary winding, said second loop including said power source, said primary winding and a diode connected in parallel with said third switching element with a polarity which permits an energy received from said secondary winding to feed back to said power source.

3. The gate circuit of a gate turn-off thyristor according to claim 1, wherein said first circuit means further includes a protective circuit connected between the cathode and gate of said gate turn-off thyristor and serving to hold the reverse voltage applied between the cathode and gate of said gate turn-off thryistor at a predetermined value, the voltage induced across the secondary winding of one of said pulse transformer and current transformer in said second circuit means being set to be below said predetermined value.

4. A gate circuit of a gate turn-off thyristor which comprises: a first circuit means connected between the cathode and gate of a gate turn-off thyristor so as to cause a first pulse current of a large rising rate and a narrow pulse width to flow as reverse current from the cathode to the gate of said gate turn-off thryistor when said gate turn-off thyristor is turned off, wherein said first circuit means includes a first switching element adapted to be turned on when said gate turn-off thyristor is turned off, a capacitor adapted to be charged to such a polarity that the discharge current from said capacitor is caused to flow reversely as said first pulse current from the cathode to the gate of said gate turn-off thyristor through said first switching element when said first switching element is rendered conductive, and a pulse transformer including first to fourth windings, said first winding being connected to a power source through a second switching element held conductive during the conduction of said gate turn-off thyristor and rendered non-conductive when said gate turn-off thyristor has been turned off, said fourth winding being connected so as to charge said capacitor to said polarity when said second switching element is rendered conductive;

a second circuit means connected in parallel to said first circuit means so as to cause reverse flow of a second pulse current of a smaller rate of rising and a wider pulse width than said first pulse current in superimposition thereupon from said cathode to gate when said gate turn-off thyristor is turned off, wherein said second circuit means includes a series circuit consisting of said second and third windings, one of the terminals of said series circuit that constitutes the positive terminal when said second switching element is closed being connected to the gate of said gate turn-off thyristor, and the other terminal of said series circuit that constitutes the negative terminal being connected to said cathode.

5. The gate circuit of a gate turn-off thyristor according to claim 4, which further comprises feed back means for feeding energy possessed by said capacitor back to said power source after said gate turn-off thyristor has been turned off; said feed back means comprising a first loop and a second loop, said first loop including said capacitor, said first switching element, said third winding and a diode coupled between terminals of said second winding with its cathode connected to the gate of said gate turn-off thryistor and with its anode to the junction of said second and third windings, said second loop including a fifth winding of said pulse transformer and a diode connected in parallel with said power source through said fifth winding, one terminal of said fifth winding which becomes positive when said second switching element is closed being connected to the cathode of said diode and the other terminal of said fifth winding being connected to the positive terminal of said power source.

* * * * *